United States Patent [19]

Ema

[11] Patent Number: 4,975,753
[45] Date of Patent: Dec. 4, 1990

[54] SEMICONDUCTOR MEMORY DEVICE HAVING AN ALUMINUM-BASED METALLIZATION FILM AND A REFRACTORY METAL SILICIDE-BASED METALLIZATION FILM

[75] Inventor: Taiji Ema, Kawasaki, Japan

[73] Assignee: Fujitsu Limited, Kawasaki, Japan

[21] Appl. No.: 266,009

[22] Filed: Nov. 2, 1988

[30] Foreign Application Priority Data

Nov. 14, 1987 [JP] Japan .................................. 62-286460

[51] Int. Cl.$^5$ ..................... H01L 29/68; H01L 23/48; H01L 27/10
[52] U.S. Cl. ...................................... 357/23.6; 357/71; 357/45
[58] Field of Search ...................... 357/71 S, 71, 23.6, 357/41, 45

[56] References Cited

U.S. PATENT DOCUMENTS 4,423,432 12/1983 Stewart et al. ....................... 357/45
4,845,544 7/1989 Shimizu ............................... 357/41
4,910,566 3/1990 Ema ................................... 357/23.6

Primary Examiner—Rolf Hille
Assistant Examiner—Robert P. Limanek
Attorney, Agent, or Firm—Staas & Halsey

[57] ABSTRACT

A semiconductor memory device includes a plurality of bit lines formed on an interlayer insulation film and arranged with a first pitch defining a distance between neighboring bit lines, and word lines which are formed on an insulation film formed on the bit lines and which are arranged with a second pitch defining a distance between neighboring word lines. One of the bit and word lines which has a relatively wide pitch comprises an aluminum-based metallization film, and the other line which has a relatively narrow pitch comprises a refractory metal silicide-based metallization film.

17 Claims, 4 Drawing Sheets

SEMICONDUCTOR MEMORY DEVICE HAVING AN ALUMINUM-BASED METALLIZATION FILM AND A REFRACTORY METAL SILICIDE-BASED METALLIZATION FILM

BACKGROUND OF THE INVENTION

The present invention generally relates to a semiconductor memory device having an aluminum-based metallization film and a refractory metal silicide-based metallization film.

Generally, in a conventional field effect transistor, source and drain regions are formed by a self-alignment process in which a gate electrode is used as a mask film. Therefore, such a gate electrode is formed by using polysilicon having a high heat-resistant property. Polysilicon has a disadvantage in that it's value of electrical resistance is higher than that of an alloy of aluminum-silicon, which is used for forming source and drain electrodes. As in a case of a dynamic random access memory (DRAM) device where a gate electrode of a polysilicon film is used as a word line, a metallization film of an aluminum-silicon alloy is formed on an insulating film positioned in a vicinity of a top surface of the DRAM device, and is connected to the gate electrode of the word line at a suitable position. That is, the aluminum-silicon metallization film is used for improving conductivity of the gate electrode. However, an aluminum-silicon alloy has a disadvantage that heat-resistance is low.

It is also known to use, as a metallization film, a polycide film which is a stacked layer consisting of a polysilicon film and a refractory metal silicide film. Compared with an aluminum-silicon metallization film, a polycide film has a disadvantage of high electric resistance and has advantages of high heat-resistance and high resistance to electromigration and stress-migration.

As can be seen from the aforementioned explanation, metallization materials have both advantages and disadvantages.

Recently, a size of a semiconductor chip of the DRAM device is limited in view of a size of a package which accommodates the semiconductor chip. For example, a standard package has a width (a short side) of approximately 7.5 (mm) (300 (mil)). Therefore, a semiconductor chip is necessarily of a rectangular shape. As a result, in a case where sense amplifiers, bit drivers and column decoders are arranged along the short side of the chip, a bit line pitch which defines a distance between centers of neighboring bit lines, must be necessarily reduced, compared with a word line pitch which defines a distance between centers of neighboring word lines arranged in a direction of a long side of the chip. On the other hand, in a case where a row driver and a row decoder (word decoder) are arranged in the short-side direction of the chip, the word line pitch must be made smaller than the bit line pitch. Therefore, it is required to provide a metallization structure suitable to the rectangular semiconductor chip.

SUMMARY OF THE INVENTION

It is therefore a general object of the present invention to provide a novel and useful semiconductor memory device having an aluminum-based metallization film and a refractory metal silicide-based metallization film which can meet the above requirement.

A more specific object of the present invention is to provide a semiconductor memory device in which one of the bit and word lines which has a relatively narrow line pitch is formed by a refractory metal silicide-based metallization film, and the other line which has a relatively wide line pitch is formed by an aluminum-based metallization film. With the above metallization structures, advantageous properties of the refractory metal silicide-based metallization and the aluminum-based metallization can be greatly utilized. A semiconductor memory device having the above-mentioned metallization structure has, an the whole, good conductivity, high heat-resistance and high electromigration and stress-migration resistance. Additionally, the production process can be simplified.

The above objects of the present invention are achieved by a semiconductor memory device which includes a semiconductor substrate; a first insulation film having a contact hole; a plurality of gate electrodes provided so as to be surrounded by the first insulation film; a storage capacitor layer including a pair of electrodes, one of the pair of electrodes being in contact with the semiconductor substrate through the contact hole; an interlayer insulation film formed on the storage capacitor layer; a plurality of bit lines formed on the interlayer insulation film and arranged with a first pitch defining a distance between neighboring bit lines; a second insulation film formed on the bit lines; and a plurality of word lines formed on the second insulation film and arranged with a second pitch defining a distance between neighboring word lines. One of the bit and word lines which has a relatively wide pitch comprises an aluminum-based metallization film, and the other line which has a relatively narrow pitch comprises a refractory metal silicide-based metallization film.

The above objects of the present invention are also be achieved by a semiconductor memory device comprising a semiconductor substrate; a first insulation film having a contact hole; a plurality of gate electrodes provided so as to be surrounded by the first insulation film and arranged with a first pitch defining a distance between neighboring gate electrodes; a storage capacitor layer including a pair of electrodes, one of the pair of electrodes being in contact with the semiconductor substrate through the contact hole; an interlayer insulation film formed so as to cover the storage capacitor layer; and a plurality of bit lines formed on the interlayer insulation film and arranged with a second pitch defining a distance between neighboring bit lines. Each of the gate electrodes comprises a refractory metal silicide-based metallization film, and each of the bit lines comprises an aluminum-based metallization film.

Other objects, features and advantages of the present invention will become apparent from the following detailed description when read in conjunction with the accompanying drawings.

DETAILED DESCRIPTION OF THE PREFERRED EMBODIMENTS

The present invention is based on the following viewpoints in order to obtain metallizations suitable for the aforementioned semiconductor chip in which it is necessary to reduce the line pitch in the short side of the semiconductor chip. Since polysilicon has high resistance, polysilicon is suitable neither for a word line metallization film which contributes to enhancing conductivity of the gate electrodes, nor for a bit line. An aluminum-based metallization such as pure aluminum and an alloy of aluminum and silicon has poor heat-resistant properties and poor electromigration and stress-migration resistance. On the other hand, the aluminum-based metallization has greatly low resistance, and is always employed in a peripheral circuit portion of the DRAM device such as a decoder circuit, a sense amplifier and a logic circuit. From the above reasons, it is advantageous to using the aluminum-based metallization provided in a memory cell portion of the DRAM device from the viewpoint of improvement in performance and manufacturing process.

It is noted that a metallization pattern of an electrode or wiring interconnection decreases in cross section as the width thereof decreases. As a result, the current density of current which flows through the metallization pattern increases, which shortens a lifetime of the device. It is noted that the lifetime depends exponentially on the current density. A reduction of the life time due to electromigration and stress-migration is different depending on material. The lifetime of a refractory metal silicide metallization film is much longer than that of the aluminum-based metallization.

From the aforementioned viewpoints, in the present invention, one of the bit and word lines which has a relatively narrow line pitch is formed by a refractory metal silicide-based metallization, and the other line which has a relatively wide line pitch is formed by an aluminum-based metallization. With the above metallization structures, advantageous properties of the refractory metal silicide-based metallization and the aluminum-based metallization can be greatly utilized. A semiconductor memory device having the above-mentioned metallization structure has good conductivity, high heat-resistance and high electromigration and stress-migration resistance.

Figure 1:
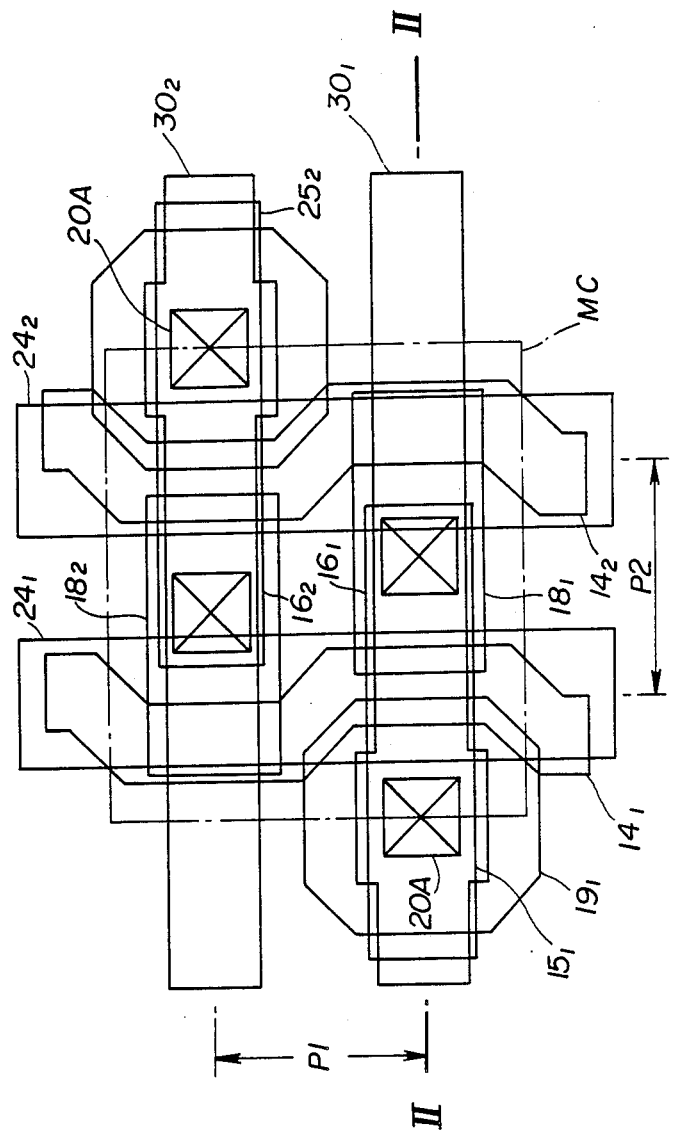
FIG. 1 is a plan view of an essential portion of a semiconductor memory device of a preferred embodiment of the present invention.
Figure 2:
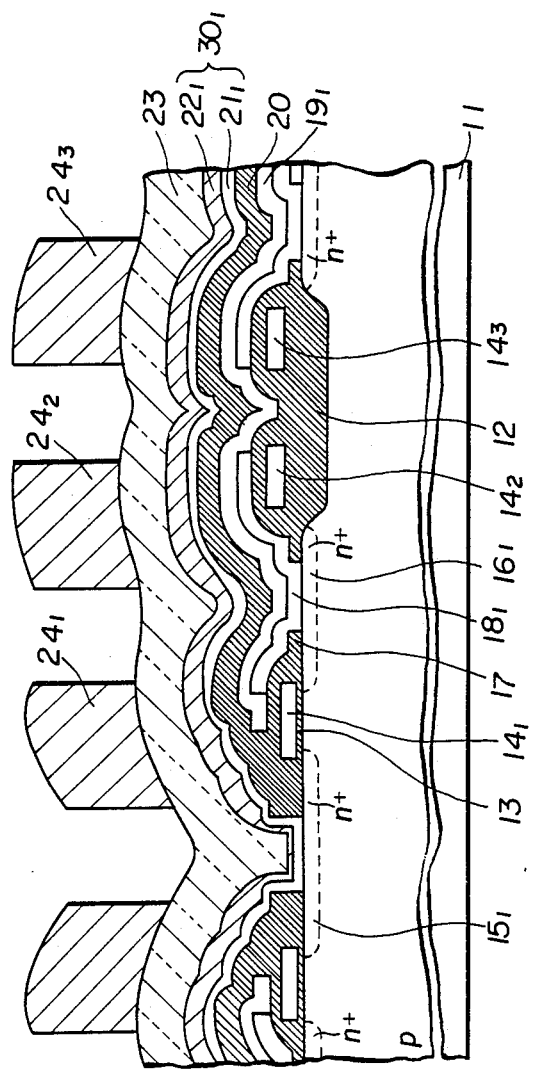
FIG. 2 is a cross sectional view taken along a line II—II shown in FIG. 1.

A description is given of a preferred embodiment of the present invention with reference to FIGS. 1 and 2. FIG. 1 is a plan view of an essential portion of a semiconductor memory device of the preferred embodiment, and FIG. 2 is a cross sectional view taken along a line II—II of FIG. 1.

Referring to FIGS. 1 and 2, a field insulation film 12 of a silicon dioxide film is formed on a main surface of a p-type silicon substrate 11 by selective thermal oxidation. A gate insulation film 13 is formed on the surface of the silicon substrate 11 by thermal oxidation. A polysilicon film is formed by chemical vapor deposition and is then patterned by the conventional photolithography technology. Thereby gate electrodes (word lines) of polysilicon films $14_1$, $14_2$, $14_3$ are formed as shown in FIG. 2. Thereafter, n+-type regions $15_1$ and $16_1$ are formed by doping the silicon substrate 11 with arsenic (As) ions by a conventional self-alignment process. The region $15_1$ is a source region, or a bit line contact region, and the region $16_1$ is a drain region, or a contact region to a storage capacitor electrode. An interlayer insulation film 17 is formed on the entire surface by chemical vapor deposition. Contact holes are formed in the interlayer insulation film 17 by anisotropic etching. Then a polysilicon film 20 is formed by chemical vapor deposition and is then patterned by the conventional photolithography technology. Thereby a storage electrode $18_1$ is formed so as to be in contact with the n+-type drain region $16_1$. The storage electrodes $18_1$ are then subjected to thermal oxidation to form a dielectric film (not shown) around the storage electrodes $18_1$. An opposed electrode (called a cell plate) $19_1$ is formed by depositing a polysilicon film and patterning the deposited polysilicon film. The opposed electrode $19_1$ is the other electrode out of the paired electrodes of the memory cell capacitor. An interlayer insulation film 20 is deposited to the entire surface. A contact hole to the source region $15_1$ is formed in the interlayer insulation film 20 and the gate insulation film by anisotropic etching. A polysilicon film $21_1$ formed on the entire surface by chemical vapor deposition. Subsequently, a tungsten silicide film $22_1$ is formed on the polysilicon film $21_1$ by sputtering. The polysilicon film $21_1$ and the tungsten silicide film $22_1$ are subjected to a patterning process based on the conventional photolithography technology. Thereby, bit lines $30_1$ and $30_2$ each consisting of the patterned polysilicon film $21_1$ and tungsten silicide film $22_1$ are formed. Then a passivation film 23 of a phosphosilicate glass (PSG) film is formed. Then an aluminum-based metallization film such as a pure aluminum film and an alloy film of aluminum and silicon is formed on the phosphosilicate glass film 23, and is then patterned. Thereby word lines $24_1$, $24_2$ and $24_3$ are formed. The word lines $24_1$, $24_2$ and $24_3$ are connected to related gate electrodes $14_1$, $14_2$ and $14_3$, and contribute to improving conductivity of the gate electrodes $14_1$, $14_2$ and $14_3$. In FIG. 1, MC indicates a memory cell portion which amounts to 2 bits.

As can be seen from FIG. 1, the memory cell portion MC has a rectangular shape and has long sides along which the bit lines $30_1$ and $30_2$ extend, and short sides along which the word lines $24_1$ and $24_2$ extend. The rectangular shape of the memory cell portion MC is necessarily determined depending on a shape of the semiconductor chip on which the memory cell portion MC is formed. That is, the shape of the chip has a rectangular shape, and therefore has long sides along which the bit lines $30_1$ and $30_2$ extend, and short sides along which the word lines $24_1$ and $24_2$ extend.

Figure 3:
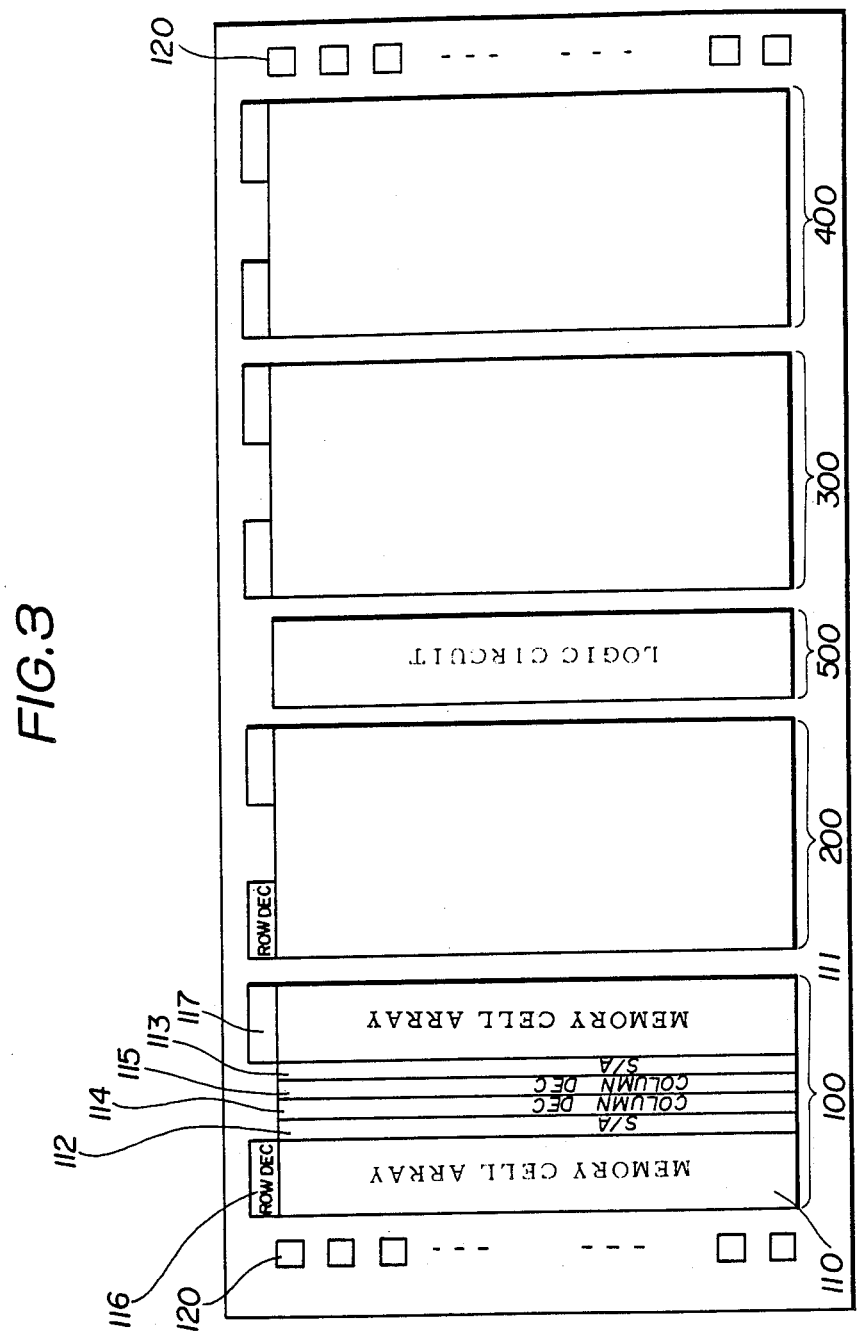
FIG. 3 is a plan view of a chip of the semiconductor memory device.

FIG. 3 is a schematic plan view of the semiconductor chip of the DRAM device. The chip comprises four identical blocks 100, 200, 300 and 400, and another block 500. Each of the blocks 100, 200, 300 and 400 includes two memory cell arrays 110 and 111, two sense amplifiers 112 and 113, two column decoders 114 and 115, and two row decoders 116 and 117. The block 500 is a logic circuit. Each of the memory cell arrays 110 and 111 has a plurality of memory cells which are arranged in the form of a matrix. Pads 120 are provided on the chip along short sides of the chip.

As shown in FIGS. 1 and 3, the sense amplifiers 112 and 113 are arranged in the short-side (width) direction of the chip, it is required to set a bit line pitch (P1) of the bit lines $30_1$ and $30_2$ narrower than a word line pitch (P2) of the word lines $24_1$ and $24_2$. As described previously, electromigration and stress-migration increase as the width of the metallization becomes narrow. From this reason, the bit lines $30_1$ and $30_2$ are constituted by polycide films, each of which consists of sequentially stacked polysilicon and tungsten silicide films, as described before. On the other hand, the word line pitch P2 of the word lines $24_1$ and $24_2$ can be wider than the bit line pitch P1. Therefore, electromigration and stress-migration occur less in the word lines $24_1$ and $24_2$ than in the bit lines $30_1$ and $30_2$. From the above reason, the word lines $24_1$ and $24_2$ are constituted by aluminum-based metallization films, as described before. With this metallization structure, good conductivity of the word lines $24_1$ and $24_2$ can be obtained.

The aforementioned structure provided by the present invention is advantageous particularly to DRAM devices. This is because DRAM devices are based on changing up/discharging operations with respect to memory cell capacitors. On the other hand, in SRAM devices, EPROM devices and mask ROM devices, a current is passed through a bit line, and a high-speed operation is particularly required. From these viewpoints, aluminum-based metallization films are generally used for forming bit lines.

Figure 4:
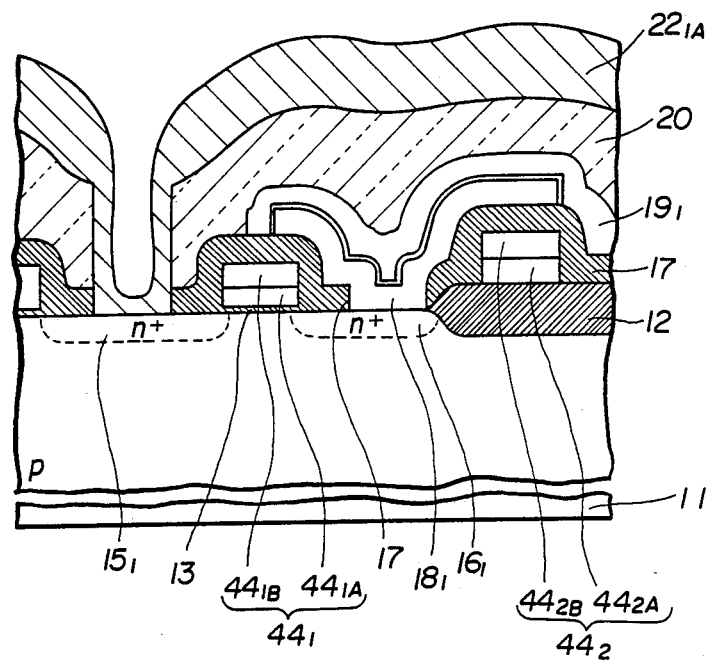
FIG. 4 is a cross sectional view of another preferred embodiment of the present invention.

A description is given of another preferred embodiment of the present invention with reference to FIG. 4. In FIG. 4, those parts which are the same as those in the previous figures are given the same reference numerals. An essential feature of the embodiment of FIG. 4 is that gate electrodes $44_1$, $44_2$, . . . are constituted by polycide films, and bit lines $22_{1A}$, . . . are constituted by aluminum-silicon alloy films. The gate electrode $44_1$ consists of a patterned polysilicon film $44_{1A}$ and a patterned tungsten silicide film $44_{1B}$. In the embodiment of FIG. 4, row decoders (not shown) are arranged in the short-side direction of the chip, and sense amplifiers (not shown) are arranged in the long side direction thereof. Therefore, the pitch P2 of the neighboring gate electrodes (or word lines) must be smaller than that (P1) of the neighboring bit lines. It is noted that since the conductivity of the polycide gates electrodes $44_1$, $44_2$, . . . is better than that of a polysilicon film, the gate electrodes $44_1$, $44_2$, . . . can be used as word lines by themselves. In other words, additional word lines such as the word lines $24_1$ and $24_2$ are not necessary to obtain satisfactory conductivity of word lines.

In the above embodiments, the tungsten silicide films $22_1$, $44_{1B}$ and $44_{2B}$ can be substituted with molybdenum silicide, tantalum silcide or titanium silicide films.

The present invention is not limited to the aforementioned embodiments, and variations and modifications may be made without departing from the scope of the present invention.

What is claimed is:

1. A semiconductor memory device comprising:
   a semiconductor substrate;
   a first insulation film having a contact hole;
   a plurality of gate electrodes provided so as to be surrounded by the first insulation film;
   a storage capacitor layer including a pair of electrodes, one of the pair of electrodes being in contact with the semiconductor substrate through the contact hole;
   an interlayer insulation film formed on the storage capacitor layer;
   a plurality of bit lines formed on the interlayer insulation film and arranged with a first pitch defining a distance between neighboring bit lines;
   a second insulation film formed on the bit lines; and
   a plurality of word lines formed on the second insulation film and arranged with a second pitch defining a distance between neighboring word lines;
   one of the bit and word lines which have a relatively wide pitch comprising an aluminum-based metallization film, and the other lines of the bit and word lines which have a relatively narrow pitch comprising a refractory metal silicide-based metallization film.

2. A semiconductor memory device as claimed in claim 1, wherein the first pitch of the bit lines is narrower than the second pitch of the word lines, so that the bit lines comprise the refractory metal silicide-based metallization films, and the word lines comprise the aluminum-based metallization films.

3. A semiconductor memory device as claimed in claim 1, wherein the refractory metal silicide-based film comprises a material selected from the group consisting of tungsten silicide, molybdenum silicide, tantalum silicide and titanium silicide.

4. A semiconductor memory device as claimed in claim 1, wherein the word lines are electrically connected to the corresponding gate electrodes.

5. A semiconductor memory device as claimed in claim 1, wherein the aluminum-based metallization film of the word line contains silicon as a minor component.

6. A semiconductor memory device as claimed in claim 1, wherein the refractory metal silicide-based metallization film comprises a refractory metal silicide film, and a polysilicon film on which the refractory metal silicide film is stacked.

7. A semiconductor memory device comprising:
   a semiconductor substrate;
   a first insulation film having a contact hole;
   a plurality of gate electrodes provided so as to be surrounded by the first insulation film and arranged with a first pitch defining a distance between neighboring gate electrodes;
   a storage capacitor layer including a pair of electrodes, one of the pair of electrodes being in contact with the semiconductor substrate through the contact hole;
   an interlayer insulation film formed so as to cover the storage capacitor layer; and
   a plurality of bit lines formed on the interlayer insulation film and arranged with a second pitch defining a distance between neighboring bit lines, wherein the second pitch is greater than the first pitch,
   each of the gate electrodes comprising a refractory metal silicide-based metallization film, and each of the bit lines comprising an aluminum-based metallization film.

8. A semiconductor memory device as claimed in claim 7, wherein the refractory metal silicide based-metallization film comprises a polysilicon film and a refractory metal silicide film which are stacked in this sequence.

9. A semiconductor memory device comprising:
   a semiconductor substrate;
   a first insulation film having a contact hole;
   a plurality of gate electrodes provided so as to be surrounded by the first insulation film;
   a storage capacitor layer including a pair of electrodes, one of the pair of electrodes being in contact with the semiconductor substrate through the contact hole;
   an interlayer insulation film formed on the storage capacitor layer;
   a plurality of bit lines formed on the interlayer insulation film and arranged with a first pitch defining a distance between neighboring bit lines;

a second insulation film formed on the bit lines;
a plurality of word lines formed on the second insulation film and arranged with a second pitch defining a distance between neighboring word lines, the second pitch being greater than the first pitch;
each of the bit lines being constituted by a refractory metal silicide-based metallization film, and each of the word lines being constituted by an aluminum-based metallization film.

10. A semiconductor memory device comprising:
a rectangular semiconductor chip having short sides and long sides;
a memory cell array including a plurality of memory cells arranged on said rectangular semiconductor chip;
a plurality of word lines coupled to said plurality of memory cells; and
a plurality of bit lines coupled to said plurality of memory cells,
ones of said plurality of word lines and said plurality of bit lines extending in a first direction in which said short sides extend, and the other of said plurality of word lines and said plurality of bit lines extending in a second direction in which said long sides extend and having a pitch narrower than said ones of the plurality of word lines and the plurality of bit lines,
said ones of the plurality of word lines and the plurality of bit lines extending in said first direction being formed of an aluminum-based metallization film, and
the other ones of said plurality of word lines and said plurality of bit lines extending in said second direction being formed of a refractory metal silicide-based metallization film.

11. A semiconductor memory device as claimed in claim 10, wherein said plurality of word lines extend in the first direction and are formed of said aluminum-based metallization film, and wherein said plurality of bit lines extend in the second direction and are formed of said refractory metal silicide-based metallization film.

12. A semiconductor memory device as claimed in claim 10, wherein said refractory metal silicide-based film comprises a material selected from the group consisting of tungsten silicide, molybdenum silicide, tantalum silicide and titanium silicide.

13. A semiconductor memory device as claimed in claim 10, wherein said memory cells comprise transistors, and said word lines are electrically connected to gate electrodes of said transistors.

14. A semiconductor memory device as claimed in claim 10, wherein said aluminum-based metallization film contains silicon as a minor component.

15. A semiconductor memory device as claimed in claim 10, wherein said refractory metal silicide-based metallization film comprises a refractory metal silicide film, and a polysilicon film on which the refractory metal silicide film is stacked.

16. A semiconductor memory device as claimed in claim 10, further comprising a sense amplifier block coupled to said plurality of bit lines and extending along said first direction in which said short edges extend.

17. A semiconductor memory device comprising:
a substantially rectangular semiconductor chip having first sides of a first length and having second sides of a second length, the second length being longer than the first length;
a memory cell array including a plurality of memory cells arranged on said substantially rectangular semiconductor chip;
first conductor lines extending in a direction substantially parallel to said first sides and coupled to said plurality of memory cells; and
second conductor lines extending in a direction substantially parallel to said second sides and coupled to said plurality of memory cells, said second conductor lines having a pitch which is narrower than said first conductor lines, said first conductor lines being formed of an aluminum-based metallization film, said second conductor lines being formed of a refractory metal silicide-based metallization film.

* * * * *